United States Patent
Miyadera

(10) Patent No.: US 9,710,206 B2
(45) Date of Patent: Jul. 18, 2017

(54) COMMUNICATIONS APPARATUS, COMMUNICATIONS METHOD, AND RECORDING MEDIUM

(71) Applicant: Tatsuya Miyadera, Kanagawa (JP)

(72) Inventor: Tatsuya Miyadera, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 15/173,329

(22) Filed: Jun. 3, 2016

(65) Prior Publication Data

US 2016/0364188 A1 Dec. 15, 2016

(30) Foreign Application Priority Data

Jun. 15, 2015 (JP) ................................ 2015-120605

(51) Int. Cl.
*H04N 1/46* (2006.01)
*G06F 3/12* (2006.01)
*H03M 5/14* (2006.01)

(52) U.S. Cl.
CPC ............ *G06F 3/1234* (2013.01); *G06F 3/121* (2013.01); *G06F 3/1297* (2013.01); *H03M 5/145* (2013.01)

(58) Field of Classification Search
None
See application file for complete search history.

(56) References Cited

U.S. PATENT DOCUMENTS

| | | | |
|---|---|---|---|
| 7,518,534 B2 * | 4/2009 | Grivna ................. | H03M 5/145 341/50 |
| 7,633,965 B2 * | 12/2009 | Shibata ............. | H04L 12/40032 370/357 |
| 7,715,769 B2 | 5/2010 | Miyadera | |
| 8,170,455 B2 | 5/2012 | Miyadera | |
| 8,294,744 B2 | 10/2012 | Kinoshita et al. | |
| 8,411,124 B2 | 4/2013 | Kinoshita et al. | |
| 8,482,588 B2 | 7/2013 | Miyadera et al. | |
| 8,576,267 B2 | 11/2013 | Kawanabe et al. | |
| 2011/0055651 A1 * | 3/2011 | Kurayama ....... | G01R 31/31813 714/738 |

(Continued)

FOREIGN PATENT DOCUMENTS

| | | |
|---|---|---|
| JP | 2005-260360 | 9/2005 |
| JP | 2011-019188 | 1/2011 |

(Continued)

*Primary Examiner* — Dung Tran
(74) *Attorney, Agent, or Firm* — Duft Bornsen & Fettig LLP

(57) ABSTRACT

A communications apparatus serially transmitting a code string including a target code includes a converter to convert first codes in the code string into second codes having bit strings longer than those of the first codes, and having first polarities and second polarities with a bit string reversed from that of the first polarity, and a transmitter to serially transmit bits of the converted second codes in order from lower-order bits. When the second code includes a number of "0" bits equal to that of "1" bits, the converter converts the second code into a second code having a polarity identical to that of a previously transmitted second code. When the second code includes the number of "0" bits differing from that of "1" bits, the converter converts the second code into a second code having a polarity differing from that of the previously transmitted second code.

18 Claims, 12 Drawing Sheets

(56) References Cited

U.S. PATENT DOCUMENTS

| | | | |
|---|---|---|---|
| 2014/0300755 A1* | 10/2014 | Funamoto | H04L 1/0045 348/187 |
| 2015/0222290 A1 | 8/2015 | Miyadera et al. | |
| 2015/0261158 A1 | 9/2015 | Miyadera | |
| 2016/0018774 A1 | 1/2016 | Abe et al. | |
| 2016/0126977 A1 | 5/2016 | Miyadera et al. | |

FOREIGN PATENT DOCUMENTS

| | | |
|---|---|---|
| JP | 2015-146525 | 8/2015 |
| JP | 2015-174407 | 10/2015 |

\* cited by examiner

FIG.2A

8BIT-DATA

| MSB (bit7) | H |
| bit6 | G |
| bit5 | F |
| bit4 | E |
| bit3 | D |
| bit2 | C |
| bit1 | B |
| LSB (bit0) | A |

FIG.2B

8B/10B CODED : 10-BIT DATA

| MSB (bit9) | j |
| bit8 | i |
| bit7 | h |
| bit6 | g |
| bit5 | f |
| bit4 | e |
| bit3 | d |
| bit2 | c |
| bit1 | b |
| LSB (bit0) | a |

FIG.2C

LVDS DRIVER

| a | b | c | d | e | f | g | h | i | j |

SERIALLY TRANSMITTING BITS IN ORDER FROM LEFT BIT

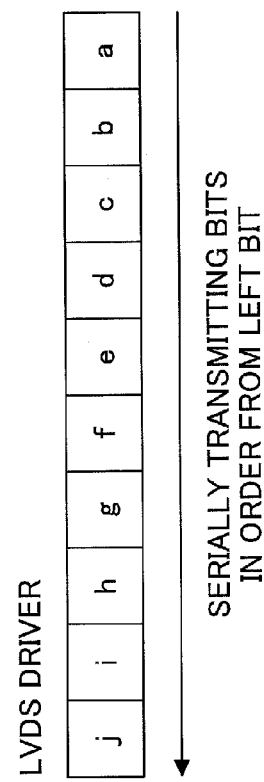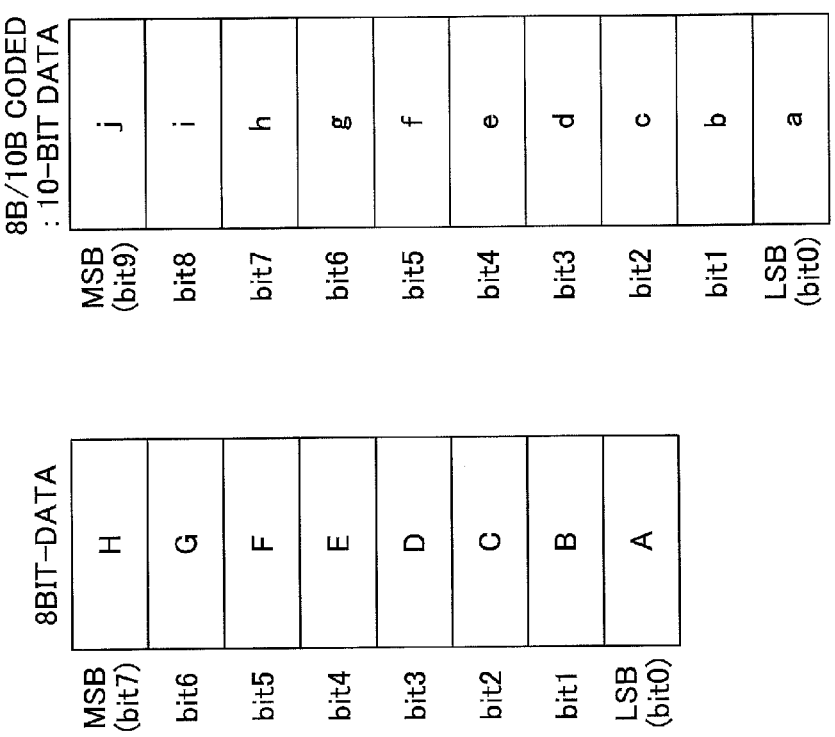

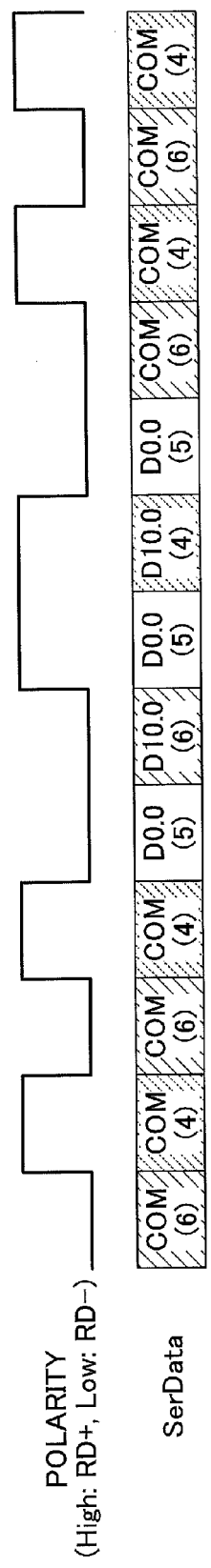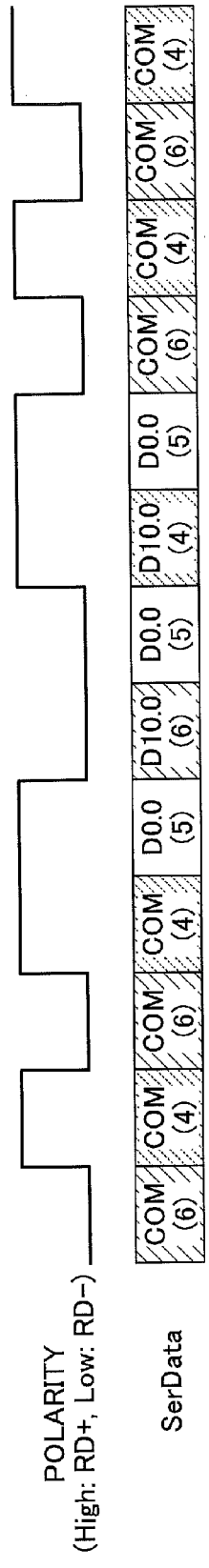

FIG.7

| SYMBOL NAME | DATA BYTE NAME | DATA BYTE VALUE (hex) | 8B CODE | 10B CODE RD− | 10B CODE RD+ | CONTENT |
|---|---|---|---|---|---|---|
| COM | K28.5 | BC | 101 11100 | 001111 1010 | 110000 0101 | LINE INTERVENING DATA (DES SYNCHRONOUS SYMBOL) |
| STP1 | K23.7 | F7 | 111 10111 | 111010 1000 | 000101 0111 | LINE DATA STARTING SYMBOL 1 |
| STP2 | K27.7 | FB | 111 11011 | 110110 1000 | 001001 0111 | LINE DATA STARTING SYMBOL 2 |
| STP3 | K29.7 | FD | 111 11101 | 101110 1000 | 010001 0111 | LINE DATA STARTING SYMBOL 3 |
| STP4 | K30.7 | FE | 111 11110 | 011110 1000 | 100001 0111 | LINE DATA STARTING SYMBOL 4 |
| STP5 | K28.7 | FC | 111 11100 | 001111 1000 | 110000 0111 | LINE DATA STARTING SYMBOL 5 |
| END1 | K28.0 | 1C | 000 11100 | 001111 0100 | 110000 1011 | LINE DATA ENDING SYMBOL 1 |
| END2 | K28.1 | 3C | 001 11100 | 001111 1001 | 110000 0110 | LINE DATA ENDING SYMBOL 2 |
| END3 | K28.2 | 5C | 010 11100 | 001111 0101 | 110000 1010 | LINE DATA ENDING SYMBOL 3 |
| END4 | K28.3 | 7C | 011 11100 | 001111 0011 | 110000 1100 | LINE DATA ENDING SYMBOL 4 |
| END5 | K28.4 | 9C | 100 11100 | 001111 0010 | 110000 1101 | LINE DATA ENDING SYMBOL 5 |
| — | K28.6 | DC | 110 11100 | 001111 0110 | 110000 1001 | — |

10BIT-DATA

10B/8B REVERSE CONVERSION : 8BIT-DATA

FIG.10

| SYMBOL NAME | DATA BYTE NAME | DATA BYTE VALUE (hex) | 8B CODE | 10B CODE RD- | 10B CODE RD+ | CONTENT |
|---|---|---|---|---|---|---|
| COM | K28.5 | BC | 101 11100 | 0101 111100 | 1010 000011 | LINE INTERVENING DATA (DES SYNCHRONOUS SYMBOL) |
| STP1 | K23.7 | F7 | 111 10111 | 0001 010111 | 1110 101000 | LINE DATA STARTING SYMBOL 1 |
| STP2 | K27.7 | FB | 111 11011 | 0001 011011 | 1110 100100 | LINE DATA STARTING SYMBOL 2 |
| STP3 | K29.7 | FD | 111 11101 | 0001 011101 | 1110 100010 | LINE DATA STARTING SYMBOL 3 |
| STP4 | K30.7 | FE | 111 11110 | 0001 011110 | 1110 100001 | LINE DATA STARTING SYMBOL 4 |
| STP5 | K28.7 | FC | 111 11100 | 0001 111100 | 1110 000011 | LINE DATA STARTING SYMBOL 5 |
| END1 | K28.0 | 1C | 000 11100 | 0010 111100 | 1101 000011 | LINE DATA ENDING SYMBOL 1 |
| END2 | K28.1 | 3C | 001 11100 | 1001 111100 | 0110 000011 | LINE DATA ENDING SYMBOL 2 |
| END3 | K28.2 | 5C | 010 11100 | 1010 111100 | 0101 000011 | LINE DATA ENDING SYMBOL 3 |
| END4 | K28.3 | 7C | 011 11100 | 1100 111100 | 0011 000011 | LINE DATA ENDING SYMBOL 4 |
| END5 | K28.4 | 9C | 100 11100 | 0100 111100 | 1011 000011 | LINE DATA ENDING SYMBOL 5 |
| - | K28.6 | DC | 110 11100 | 0110 111100 | 1001 000011 | - |

FIG.11A

FORWARD SERIALIZER

| 00000 GENERATED AT STP-DATA BOUNDARY | 11111 GENERATED AT STP-DATA BOUNDARY |
|---|---|
| K23.7,RD− (5) / D12.0,RD− (6) = F7 − 0C | K23.7,RD+ (5) / D3.0,RD+ (4) = F7 − 03 |
| K23.7,RD− (5) / D20.0,RD− (6) = F7 − 14 | K23.7,RD+ (5) / D11.0,RD+ (4) = F7 − 0B |
| K27.7,RD− (5) / D12.0,RD− (6) = FB − 0C | K27.7,RD+ (5) / D3.0,RD+ (4) = FB − 03 |
| K27.7,RD− (5) / D20.0,RD− (6) = FB − 14 | K27.7,RD+ (5) / D11.0,RD+ (4) = FB − 0B |
| K28.7,RD− (5) / D12.0,RD− (6) = FC − 0C | K28.7,RD+ (5) / D3.0,RD+ (4) = FC − 03 |
| K28.7,RD− (5) / D20.0,RD− (6) = FC − 14 | K28.7,RD+ (5) / D11.0,RD+ (4) = FC − 0B |
| K29.7,RD− (5) / D12.0,RD− (6) = FD − 0C | K29.7,RD+ (5) / D3.0,RD+ (4) = FD − 03 |
| K29.7,RD− (5) / D20.0,RD− (6) = FD − 14 | K29.7,RD+ (5) / D11.0,RD+ (4) = FD − 0B |
| K30.7,RD− (5) / D12.0,RD− (6) = FE − 0C | K30.7,RD+ (5) / D3.0,RD+ (4) = FE − 03 |
| K30.7,RD− (5) / D20.0,RD− (6) = FE − 14 | K30.7,RD+ (5) / D11.0,RD+ (4) = FE − 0B |

FIG.11B

REVERSE SERIALIZER

| 00000 GENERATED AT STP-DATA BOUNDARY | 11111 GENERATED AT STP-DATA BOUNDARY |
|---|---|
| K28.7,RD− (5) / D11.7,RD+ (4) = FC − EB | K28.7,RD+ (5) / D17.7,RD− (6) = FC − F1 |
| K28.7,RD− (5) / D13.7,RD+ (4) = FC − ED | K28.7,RD+ (5) / D18.7,RD− (6) = FC − F2 |
| K28.7,RD− (5) / D14.7,RD+ (4) = FC − EE | K28.7,RD+ (5) / D20.7,RD− (6) = FC − F4 |

FIG.12A

| FORWARD SERIALIZER | |
|---|---|
| 00000 GENERATED AT DATA-END BOUNDARY | 11111 GENERATED AT DATA-END BOUNDARY |
| D11.7,RD+ (4) / K28.0,RD− (5) = EB − 1C | D17.7,RD− (6) / K28.0,RD+ (5) = F1 − 1C |
| D11.7,RD+ (4) / K28.1,RD− (6) = EB − 3C | D17.7,RD− (6) / K28.1,RD+ (4) = F1 − 3C |
| D11.7,RD+ (4) / K28.2,RD− (6) = EB − 5C | D17.7,RD− (6) / K28.2,RD+ (4) = F1 − 5C |
| D11.7,RD+ (4) / K28.3,RD− (6) = EB − 7C | D17.7,RD− (6) / K28.3,RD+ (4) = F1 − 7C |
| D11.7,RD+ (4) / K28.4,RD− (5) = EB − 9C | D17.7,RD− (6) / K28.4,RD+ (5) = F1 − 9C |
| D13.7,RD+ (4) / K28.0,RD− (5) = ED − 1C | D18.7,RD− (6) / K28.0,RD+ (5) = F2 − 1C |
| D13.7,RD+ (4) / K28.1,RD− (6) = ED − 3C | D18.7,RD− (6) / K28.1,RD+ (4) = F2 − 3C |
| D13.7,RD+ (4) / K28.2,RD− (6) = ED − 5C | D18.7,RD− (6) / K28.2,RD+ (4) = F2 − 5C |
| D13.7,RD+ (4) / K28.3,RD− (6) = ED − 7C | D18.7,RD− (6) / K28.3,RD+ (4) = F2 − 7C |
| D13.7,RD+ (4) / K28.4,RD− (5) = ED − 9C | D18.7,RD− (6) / K28.4,RD+ (5) = F2 − 9C |
| D14.7,RD+ (4) / K28.0,RD− (5) = EE − 1C | D20.7,RD− (6) / K28.0,RD+ (5) = F4 − 1C |
| D14.7,RD+ (4) / K28.1,RD− (6) = EE − 3C | D20.7,RD− (6) / K28.1,RD+ (4) = F4 − 3C |
| D14.7,RD+ (4) / K28.2,RD− (6) = EE − 5C | D20.7,RD− (6) / K28.2,RD+ (4) = F4 − 5C |
| D14.7,RD+ (4) / K28.3,RD− (6) = EE − 7C | D20.7,RD− (6) / K28.3,RD+ (4) = F4 − 7C |
| D14.7,RD+ (4) / K28.4,RD− (5) = EE − 9C | D20.7,RD− (6) / K28.4,RD+ (5) = F4 − 9C |

FIG.12B

| REVERSE SERIALIZER | |
|---|---|
| 00000 GENERATED AT DATA-END BOUNDARY | 11111 GENERATED AT DATA-END BOUNDARY |
| NONE | NONE |

COMMUNICATIONS APPARATUS, COMMUNICATIONS METHOD, AND RECORDING MEDIUM

CROSS-REFERENCE TO RELATED APPLICATIONS

The present application is based on and claims the benefit of priorities of Japanese Priority Application No. 2015-120605 filed on Jun. 15, 2015, the entire contents of which are hereby incorporated by reference.

BACKGROUND OF THE INVENTION

1. Field of the Invention

The disclosures herein generally relate to a communications apparatus, a communications method, and a computer-readable storage medium storing the communications method.

2. Description of the Related Art

Transmitting high or low level serial data successively a predetermined number of times or more in high-speed serial communications may make signals unstable, which is likely to generate transmission errors.

A related art high-speed serial communications technology employing 8B10B conversion for converting 8 bit data into 10 bit data has limited the number of successive transmissions of high level or low level serial data not to exceed six by performing an RD control to switch between two positive and negative polarity codes. In the following, nT represents n number of successive serial data.

Further, a serializer of a transmitter assigns a STP code to a head of image data and an END code to a tail of the image data. A deserializer of a receiver verifies the STP code and END code to receive the image data. The related art technology stabilizes the communications quality at the image transmission (image transfer) in the above-described manner.

To encode 10 bit data with two polarities RD+ and RD−, Patent Document 1, for example, discloses a communications method of transmitting RD+ data first and RD− data second to adjust a DC balance, and transmitting serial data with differential signals.

RELATED ART DOCUMENT

Patent Document

Patent Document 1: Japanese Unexamined Patent Application Publication No. 2011-19188

However, transferring data using 8B10B conversion or the like by the related art technology may make signals unstable.

Even when serial data transferred at several GHz is limited to the maximum of 5T, signals may still be unstable. For example, transferring the image data serially may generate 5T at the boundary between the STP code or the END code and the image data to lower the DC balance, which may generate errors in the deserializer. The deserializer may fail to detect the STP code due to the generated errors, leading to discarding a line of the image data.

SUMMARY OF THE INVENTION

Accordingly, it is a general object in one embodiment of the present invention to provide a technology capable of stabilizing states of signals for serially transmitting data using 8B10B conversion or the like that substantially obviates one or more problems caused by the limitations and disadvantages of the related art.

According to an aspect of embodiments, there is provided a communications apparatus serially transmitting a code string including a target code subject to transmission. The communications apparatus includes a converter configured to convert first codes included in the code string into second codes, respectively, the second codes having bit strings longer than bit strings of the first codes, the second codes each having first polarities and second polarities, the second polarity having a bit string reversed from a bit string associated with the first polarity, wherein when the second code includes a number of "0" bits equal to a number of "1" bits, the converter converts the second code into a second code having a polarity identical to the polarity of a previously transmitted second code, and wherein when the second code includes the number of "0" bits differing from the number of "1" bits, the converter converts the second code into a second code having a polarity differing from the polarity of the previously transmitted second code; and a transmitter configured to serially transmit the bits of each of the converted second codes in order from lower-order bits.

Other objects, features and advantages of the present invention will become more apparent from the following detailed description when read in conjunction with the accompanying drawings.

BRIEF DESCRIPTION OF THE DRAWINGS

FIGS. 2A to 2C are diagrams illustrating a data output process of a forward-order serializer;

FIGS. 3A to 3C are diagrams illustrating a first data output process of a reverse-order serializer;

FIGS. 4A to 4C are diagrams illustrating a second data output process of the reverse-order serializer;

FIGS. 5A and 5B are diagrams illustrating an RD rule;

FIG. 7 is a diagram illustrating an example of a conversion table;

FIG. 10 is a diagram illustrating an example of a conversion table for use in a deserializing process;

FIGS. 11A and 11B are diagrams illustrating examples of combinations that generate 5T between a STP code and a head end of the image data; and FIGS. 12A and 12B are diagrams illustrating examples of combinations that generate 5T between an END code and a tail end of the image data.

DETAILED DESCRIPTION OF THE PREFERRED EMBODIMENTS

In the following, a description is given of embodiments of the present invention with reference to the accompanying drawings. Note that duplicated descriptions may be omitted by assigning identical reference numbers to those components having substantially the same functional configurations in the specification and the drawings of the present application.

First Embodiment

Figure 1:
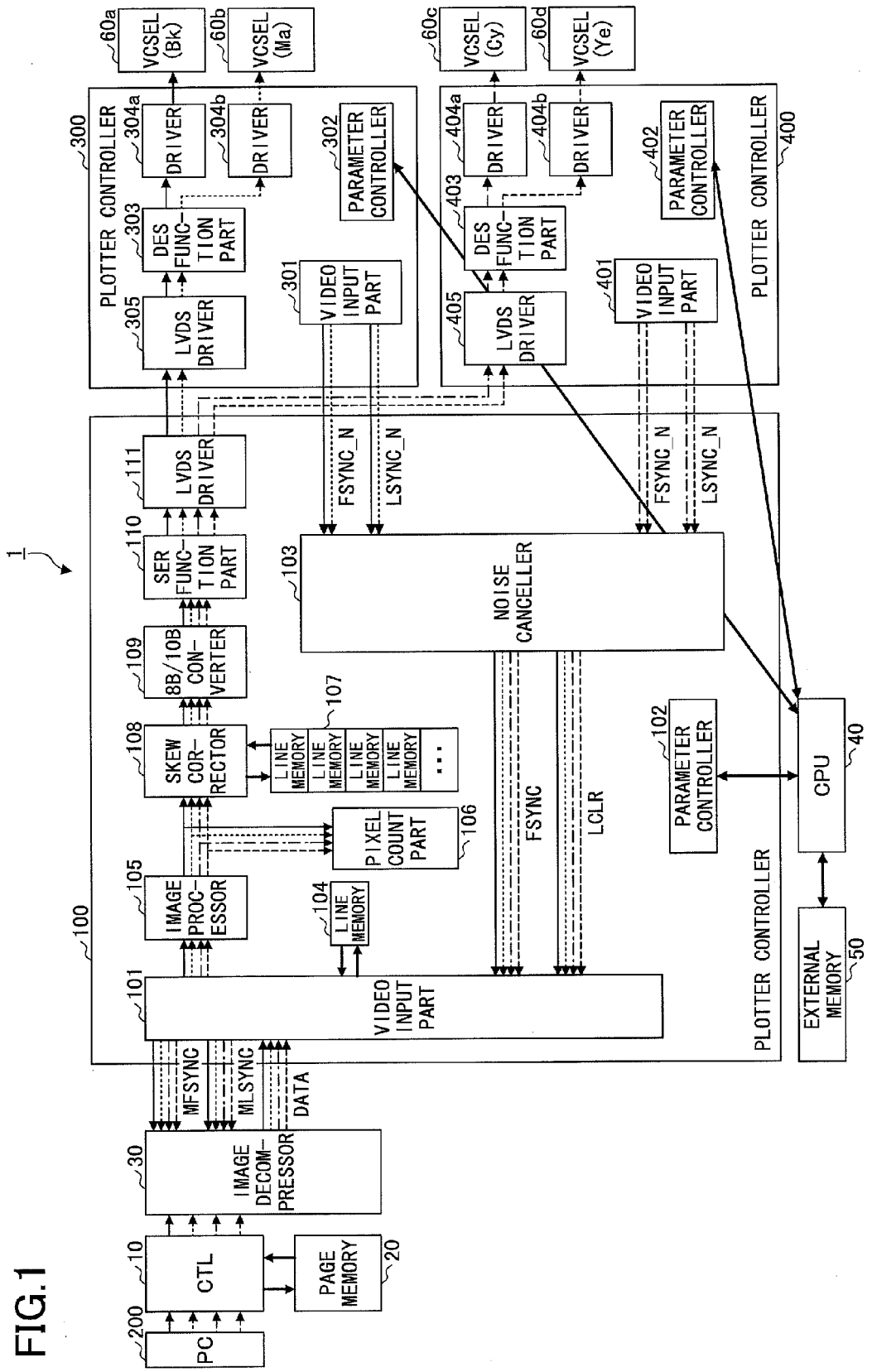
FIG. 1 is a diagram illustrating a configuration example of a writing data transfer system.

FIG. 1 is a diagram illustrating a configuration example of a writing data transfer system 1. The writing data transfer system 1 includes a controller (CTL) 10, a page memory 20, an image decompressor 30, a CPU 40, an external memory 50, a vertical cavity surface emitting laser (VCSEL) (Black (Bk)) 60a, a VCSEL (Magenta (Ma)) 60b, a VCSEL (Cyan (Cy)) 60c, a VCSEL (Yellow (Ye)) 60d, a plotter controller 100, a personal computer (PC) 200, a plotter controller 300, and a plotter controller 400. Note that the VCSEL (Bk) 60a, VCSEL (Ma) 60b, VCSEL (Cy) 60c, and VCSEL (Ye) 60d that are not individually identified may be generically referred to as a "VCSEL 60".

The plotter controller 100 is configured to correct image data transmitted from the PC 200 such as area gradation correction, edge correction, and skew correction, and serially transfer the corrected image data to the plotter controller 300 and the plotter controller 400 at high speed (high-speed serial transfer).

The plotter controller 100 includes a video input part 101, a parameter controller 102, a noise canceller 103, a line memory 104, an image processor 105, a pixel count part 106, a line memory group 107, a skew corrector 108, an 8B/10B converter 109, a serializer (SER) function part 110, a low voltage differential signaling (LVDS) driver 111.

The PC 200 is configured to transmit, when receiving print instruction from a user, an image file such as GIF or JPEG to the CTL 10 via a printer driver. The CTL 10 is configured to convert the received image file into image data such as bitmap data, and transfer the converted image data to the image decompressor 30.

The image decompressor 30 is configured to mutually communicate with the video input part 101 to transfer the image data to the plotter controller 100. More specifically, the image decompressor 30 transfers the image data per line to the plotter controller 100 every time the MFSYNC signal has been output from the video input part 101. Note that the MFSYNC signal is a synchronous pulse signal indicating a head of a page. The MFSYNC signal also serves as a synchronous pulse signal indicating a head of a line.

The image decompressor 30 is configured to transfer a line of the image data to the video input part 101 in accordance with timing at which the MFSYNC signal is output from the video input part 101 for each of colors (black, magenta, cyan, and yellow). Note that the image decompressor 30 may also transfer the image data of color other than black, magenta, cyan, and yellow to the video input part 101.

The CPU 40 is configured to generate a start trigger signal to transmit the generated start trigger signal to a parameter controller 302 and a parameter controller 402, when detecting completion of image forming preparation by referring to the external memory 50.

A video input part 301 and a video input part 401 are configured to generate start triggers based on the received start trigger signals. The video input part 301 is configured to transmit black FSYNC_N and LSYNC_N signals, and magenta FSYNC_N and LSYNC_N signals based on the generated start trigger, and transmit the generated black FSYNC_N and LSYNC_N signals, and magenta FSYNC_N and LSYNC_N signals to the noise canceller 103. Similarly, the video input part 401 is configured to transmit cyan FSYNC_N and LSYNC_N signals, and yellow FSYNC_N and LSYNC_N signals based on the generated start trigger, and transmit the generated cyan FSYNC_N and LSYNC_N signals, and yellow FSYNC_N and LSYNC_N signals to the noise canceller 103.

The noise canceller 103 is configured to cancel noise such as an electrostatic pulse included in the FSYNC_N and LSYNC_N signals received from the video input part 301 and the video input part 401.

Note that when an image forming apparatus incorporating the writing data transfer system 1 of the embodiment manages high-speed printing exceeding 100-plus ppm, not-illustrated photoconductor drums and polygon motors need to operate at high speeds. Implementing the high-speed photoconductor drums and polygon motors requires high power drive motors and large diameter photoconductor drums. The large drive units increase distances between the units as a result.

Owing to the large drive units, the VCSELs 60 configured to expose respective photoconductor drums need to be located at distant positions, and the plotter controller 300 and the plotter controller 400 configured to control the VCSELs 60 need to be located at distant positions. The plotter controller 100 connected to the plotter controller 300 and the plotter controller 400 needs to be located at a distant position. As a result, the plotter controller 300 and the plotter controller 400 may be located several meters away from the plotter controller 100.

Thus, the FSYNC_N and LSYNC_N signals are transmitted from the plotter controller 300 and the plotter controller 400 to the plotter controller 100 through signal lines several meters long where the FSYNC_N and LSYNC_N signals are more likely to be affected by noise.

Thus, a receiver configured to receive the FSYNC_N and LSYNC_N signals needs to have a noise cancelling circuit.

The image decompressor 30 and the plotter controller 100 do not have specific physical alignment constraints, and the image decompressor 30 and the plotter controller 100 may be located nearby. Thus, a receiver configured to receive MFSYNC and MLSYNC signals does not necessary have a noise cancelling circuit.

The noise canceller 103 is configured to transfer the received FSYNC_N signal as FSYNC signal to the video input part 101.

The noise canceller 103g generates one line clear (LCLR) signal for every four LSYNC_N signals based on the FSYNC signal as origin, and transmits the generated LCLR signal to the video input part 101. More specifically, the noise canceller 103 generates the LCLR signal by providing a predetermined time difference between colors, and transmits the generated LCLR signal to the video input part 101. For example, the noise canceller 103 may sequentially generates LCLR signals in the order of a black LCLR signal, a magenta LCLR signal, a cyan LCLR signal, and a yellow LCLR signal, and transmit the LCLR signals in the order of the generated LCLR signals to the video input part 101.

The video input part 101 is configured to generate MFSYNC and MLSYNC signals for each of the colors (black, magenta, cyan, and yellow) based on the received LCLR signal as origin, and transmit the generated MFSYNC and MLSYNC signals to the image decompressor 30. The video input part 101 thus sequentially receives a line of the image data for each color from the image decompressor 30 in accordance with MFSYNC and MLSYNC signal transmission timing. Note that the video input part 101 is configured to operate synchronously with the same clock as the image decompressor 30.

The video input part 101 is configured to write the line of the image data received from the image decompressor 30 to the line memory 104. The video input part 101 reads four lines of the image data by sandwiching the LCLR signals between the lines after the four lines of the image data are written in the line memory 104. Note that the video input part 101 may be able to set the timing of the writing process and the reading process between the LCLR signals. For example, the video input part 101 may set the timing to write the line of the image data twice in the line memory 104 at a former part of an interval between the LCLR signals, and read the line twice from the line memory 104 at a latter part of the interval between the LCLR signals. The video input part 101 may also set the timing to write the line of the image data four times in the line memory 104 after a first LCLR signal, and read the line four times from the line memory 104 after a second LCLR signal.

The video input part 101 subsequently performs area gradation correction on pixel data. The area gradation correction indicates correction involving pseudo gradation expression using pixels at an output side corresponding to coordinates of one pixel at an input side. The video input part 101 transmits the area gradation corrected image data to the image processor 105. Note that the area gradation correction may be performed by the image processor 105 that will be described in detail later.

The area gradation correction is performed in a system that employs a light-emitting device, such as an LEDA, configured to output binary expression alone. The area gradation correction does not need to be performed when the system employs a light-emitting device, such as an LD, configured to output multivalued expression using PWM. The VCSEL includes 20 to 40 LDs placed in high density. Thus, the VCSEL may be able to sufficiently output high-definition images (1200×2400 dpi) even if each LD only outputs binary expression. Further, the VCSEL may be able to output super-high definition images (1200×2400 dpi) by PWM controlling each LD. Hence, the VCSEL system employing the VCSEL may use the VCSEL by switching between whether to perform the area gradation correction, based on whether the VCSEL system uses the binary expression.

The image processor 105 may perform an image data process with respect to a set of the received pixels such as (1) the edge correction, (2) trimming correction, and (3) internal pattern superimposition.

The edge correction (1) involves detecting edges from the image data and smoothing the edges. The area gradation corrected image data may be susceptible to generating edges. The image processor 105 may be able to smooth the edges in the area gradation corrected image data by performing the edge correction after performing the area gradation correction.

The trimming correction (2) involves deleting unnecessary portions of the image data. The image processor 105 may, for example, perform trimming correction in a main-scanning direction and sub-scanning direction to match a trimming boundary with a printable area on a sheet.

The internal pattern superimposition (3) involves superimposing pattern images such as a forgery guard pattern and an adjustment pattern on the image data. Examples of the adjustment pattern includes a density adjustment pattern, a color shift pattern, and a blade curling preventing pattern. The image processor 105 is configured to generate the respective patterns to match the resolution of the VCSEL 60, and superimpose the generated patterns on the image data so as to generate optimal image data for the VCSEL 60.

Note that when the image processor 105 performs jaggy correction on the image data, the image processor 105 may use a not-illustrated line memory to perform the correction.

The image processor 105 writes the image processed image data in the skew correction line memory group 107. When the skew correction line memory group 107 may allow Mbit recording in one address, the image processor 105 may be able to write the image data corresponding to the M pixels in one address. This may allow the skew correction line memory group 107 to record the image processed image data with minimum memory capacity.

The pixel count part 106 is configured to count a number of pixels included in the image processed image data. The CPU 40 may compute the amount charged to a user in accordance with the number of pixels counted by the pixel count part 106. The pixel count part 106 may also count a number of pixels of the pattern images such as a test pattern, the forgery guard pattern, and the adjustment pattern in addition to the number of pixels of the image data. This enables the user to accurately identify the amount of toner consumed.

The plotter controller 100 is configured to simultaneously process the four lines of the image data written in the line memory 104 of the video input part 101 via multiple data paths until the four lines are written in the skew correction line memory group 107.

The image processor 105 may be able to simultaneously refer to two dimensional data by several pixels in the main-scanning direction and the sub-scanning direction using the multiple data paths, thereby improving accuracy in the edge correction and jaggy correction. The image processor 105 may be able to improve a transfer rate of the image data using the multiple data paths, which further improves the speed of printing processing. The image processor 105 may also be able to transfer the image data obtained by super imposing the high resolution patterns on high resolution image data without delay using the multiple data paths. The video input part 101 may perform image processing such as the area gradation correction on the image data copied in the main-scanning direction and the sub-scanning direction, and transfer the obtained high resolution image data via the multiple data paths.

The skew corrector 108 is configured to perform skew correction on the image data recorded in the skew correction line memory group 107 by switching the line memories read in accordance with a position of the image data. The skew corrector 108 reads the skew correction line memory group 107 with a 1/N a period in which the image processor 105 writes the image data in the skew correction line memory group 107. The resolution of the skew corrected image data in the sub-scanning direction is increased by N times, thereby improving the resolution of the image data.

The 8B/10B converter 109 is configured to convert an 8-bit code string (image data) received from the skew corrector 108 into 10-bit code string based on a conversion table. The 8B/10B converter 109 places the converted 10-bit code string in a coded block.

The SER function part 110 is configured to convert the 10-bit parallel data (image data) placed in the coded block into serial data by dividing the 10-bit parallel data into ten one bit at a time. The SER function part 110 serially transmits black and magenta image data to the plotter controller 300, and serially transmits the cyan and yellow image data to the plotter controller 400. Note that the process of serializing will be described later.

The plotter controller 300 includes a video input part 301, a parameter controller 302, a DES function part 303, a driver 304*a*, *a*, a driver 304*b*, and an LVDS driver 305. The plotter controller 400 includes a video input part 401, a parameter controller 402, a DES function part 403, a driver 404*a*, the driver 404*b*, and an LVDS driver 402.

The DES function part 303 is configured to receive the 10-bit black code string and 10-bit magenta code string via the LVDS driver 305. The DES function part 303 reversely converts the 10-bit black code string and 10-bit magenta code string into the 8-bit black code string and 8-bit magenta code string, and outputs the 8-bit black code string to the driver 304a and the 8-bit magenta code string to the driver 304b. The driver 304a is configured to turn on the VCSEL (Bk) 60a to emit light based on the output 8-bit black code string. Similarly, the driver 304b is configured to turn on the VCSEL (Ma) 60b to emit light based on the output 8-bit magenta code string.

The DES function part 403 is configured to receive the 10-bit cyan code string and 10-bit yellow code string via the LVDS driver 405. The DES function part 403 reversely converts the 10-bit cyan code string and 10-bit yellow code string into the 8-bit cyan code string and 8-bit yellow code string, and outputs the 8-bit cyan code string to the driver 304c and the 8-bit yellow code string to the driver 304d. The driver 304c is configured to turn on the VCSEL (Cy) 60c to emit light based on the output 8-bit cyan code string. Similarly, the driver 304d is configured to turn on the VCSEL (Ye) 60d to emit light based on the output 8-bit yellow code string.

The first embodiment describes an example of serial transmission of two color image data to two plotter controllers; however, the invention is not limited to this example. For example, four color (black, magenta, cyan, and yellow) image data may be serially transmitted to four plotter controllers, respectively.

Note that the optical system employed may be a multiple laser diode (LD), or an LED array (LEDA) other than the VCSEL.

The following illustrates a forward-order serializer process and a reverse-order serializer process with reference to FIGS. 2A to 2C, FIGS. 3A to 3C, and FIGS. 4A to 4C.

FIGS. 2A to 2C are diagrams illustrating a data output process of the forward-order serializer process. FIG. 2A illustrates an 8-bit coded block. The bit in the lowest position indicates the least significant bit (LSB), and the bit in the highest position indicates the most significant bit (MSB). The 8B/10B converter 109 is configured to acquire 8 bits of the received image data in order from the higher-order bits, and store the acquired bits in order from the LSB of the coded block. For example, when the 8B/10B converter 109 stores the 8-bit strings ABCDEFGH (A is the highest-order bit, and H is the lowest-order bit) in an 8-bit coded block, the 8B/10B converter 109 stores A, B, C, D, E, F, G, and H bits in order from the LSB of the 8-bit coded block, as illustrated in FIG. 2A. Subsequently, the 8B/10B converter 109 converts the 8-bit strings into 10-bit strings based on a conversion table to acquire 10-bit strings in order from the higher-order bits, and stores the acquired 10-bit strings in order from the LSB of the coded block. FIG. 2B indicates a 10-bit coded block that has stored the 10-bit strings in order from the LSB. For example, when the 8B/10B converter 109 stores the 10-bit strings abcdefghij (a is the highest-order bit, and j is the lowest-order bit) in an 10-bit coded block, the 8B/10B converter 109 stores a, b, c, d, e, f, g, h, i and j bits in order from the LSB of the 10-bit coded block, as illustrated in FIG. 2B.

FIG. 2C indicates a transmission order of the bits transmitted by the LVDS driver 111. The SER function part 110 is configured to convert parallel data stored in the 10-bit coded block into serial data, set the 10-bit serial data in the LVDS driver 111, and serially transmit the set serial data to the plotter controller 300 and the plotter controller 400, as illustrated in FIG. 2C. The forward-order indicates a transfer order of bit strings from the highest-order bit to the lowest-order bit associated with the image data to be transferred. That is, a, b, c, d, e, f, g, h, i and j bits are transmitted from a bit in the stored order from the LSB illustrated in FIG. 2B. In the following, a forward-order serializer transmission indicates transmission of data placed in order from the LSB.

FIGS. 3A to 3C are diagrams illustrating a first data output process of a reverse-order serializer. FIG. 3A illustrates an 8-bit coded block. The 8B/10B converter 109 is configured to acquire 8 bits of the received image data in order from the higher-order bits, and store the acquired bits in order from the LSB of the coded block. For example, when the 8B/10B converter 109 stores the 8-bit strings ABCDEFGH (A is the highest-order bit, and H is the lowest-order bit) in an 8-bit coded block, the 8B/10B converter 109 stores A, B, C, D, E, F, G, and H bits in order from the LSB of the 8-bit coded block, as illustrated in FIG. 3A. Subsequently, the 8B/10B converter 109 converts the 8-bit strings into 10-bit strings based on a conversion table to acquire 10-bit strings in order from the higher-order bits, and stores the acquired 10-bit strings in order from the LSB of the coded block. FIG. 3B indicates a 10-bit coded block that has stored the 10-bit strings in order from the LSB. For example, when the 8B/10B converter 109 stores the 10-bit strings abcdefghij (a is the highest-order bit, and j is the lowest-order bit) in an 10-bit coded block, the 8B/10B converter 109 stores a, b, c, d, e, f, g, h, i and j bits in order from the LSB of the 10-bit coded block, as illustrated in FIG. 3B.

FIG. 3C indicates a transmission order of serial data transmitted by the LVDS driver 111. The SER function part 110 is configured to convert 10-bit parallel data into 10-bit serial data, set 10-bit strings in a reverse-order in the LVDS driver 111, and serially transmit the 10-bit strings set in the reverse-order to the plotter controller 300 and the plotter controller 400, as illustrated in FIG. 2C. The reverse-order indicates a transfer order of bit strings from the highest-order bit to the lowest-order bit associated with the image data to be transferred. That is, j, h, g, f, e, d, c, b and a bits are transmitted from j bit in the stored order from the MSB illustrated in FIG. 3B. In the following, a reverse-order serializer transmission indicates transmission of data placed in order from the MSB.

FIGS. 4A to 4C are diagrams illustrating a second data output process of the reverse-order serializer. The 8B/10B converter 109 is configured to acquire 8 bits of the received image data in order from the higher-order bits, and store the acquired bits in order from the LSB of the coded block. For example, when the 8B/10B converter 109 stores the 8-bit strings ABCDEFGH (A is the highest-order bit, and H is the lowest-order bit) in an 8-bit coded block, the 8B/10B converter 109 stores A, B, C, D, E, F, G, and H bits in order from the LSB of the 8-bit coded block, as illustrated in FIG. 4A. Subsequently, the 8B/10B converter 109 converts the 8-bit strings into 10-bit strings based on a conversion table to acquire 10-bit strings in order from the higher-order bits, and stores the acquired 10-bit strings in order from the MSB of the coded block. For example, when the 8B/10B converter 109 stores the 10-bit strings abcdefghij (a is the highest-order bit, and j is the lowest-order bit) in an 10-bit coded block, the 8B/10B converter 109 stores a, b, c, d, e, f, g, h, i and j bits in order from the MSB of the 10-bit coded block, as illustrated in FIG. 4B.

The SER function part 110 is configured to convert 10-bit parallel data into 10-bit serial data, set 10-bit strings in a forward-order in the LVDS driver 111, and serially transmit the 10-bit strings set in the forward-order to the plotter controller 300 and the plotter controller 400, as illustrated in FIG. 4C. That is, j, h, g, f, e, d, c, b and a bits are transmitted from j bit in the stored order from the LSB illustrated in FIG. 4B.

FIGS. 5A and 5B are diagrams illustrating RD rules. FIG. 5A indicates a forward-order RD rule, and FIG. 5B indicates a reverse-order RD rule. The upper parts of FIGS. 5A and 5B indicate RD+ and RD− polarity data selection. In FIG. 5A, a high level indicates RD+, and a low level indicates RD−. The lower parts of FIGS. 5A and 5B indicate arrays of 10-bit serial data to be transferred. Each row indicates 10-bit serial data. In FIGS. 5A and 5B, "COM" indicates a symbol code COM. The COM symbol code is used for recognizing data being other than the image data when a signal is negated. The "COM" symbol code is hereinafter called a "COM code". Further, "Dm.n (m and n are an integer)" within the row indicates an image data code. That is, m and n each indicate the number of data code group. Positive or Negative 10-bit codes are associated with each of 8-bit codes. The numeric value in the bracket within the row indicates the number of "1" bits included in the 10-bit serial data. For example, "COM (6)" indicates that the COM code includes six "1" bits.

The 10-bit code includes two polarities of RD+ and RD−. The 8B/10B converter 109 converts the 8-bit code into the 10-bit code having one of the polarities of RD+ and RD− based on the RD rules. The "RD rules" are used for selecting one of polarities of RD+ and RD− when the 8-bit code is converted into the 10-bit code. The "forward-order RD rule" indicates the RD rule for transmitting 10-bit codes in the forward-order. In the forward-order RD rule, when the number of "1" bits in a currently transmitting 10-bit code is five, a subsequently transmitting 10-bit code has data having a polarity the same as the polarity of data of the currently transmitting 10-bit code. On the other hand, when the number of "1" bits in a currently transmitting 10-bit code is other than five, a subsequently transmitting 10-bit code has data having a polarity differing from the polarity of data of the currently transmitting 10-bit code.

In FIG. 5A, for example, the third serial data from the left has six "1" bits. Hence, the SER function part 110 reverses the polarity of the next fourth code from RD− to RD+. Subsequently, the fourth serial data has four "1" bits. Hence, the SER function part 110 reverses the polarity of the next fifth code from RD+ to RD−. Subsequently, the fourth serial data has five "1" bits. Hence, the SER function part 110 maintains the polarity of the next sixth code as RD−.

The "reverse-order RD rule" indicates the RD rule for transmitting 10-bit codes in the reverse-order. In the reverse-order RD rule, when the number of "1" bits in a currently transmitting 10-bit code is five, the currently transmitting 10-bit code has data having a polarity the same as the polarity of data of a previously transmitting 10-bit code. On the other hand, when the number of "1" bits in a currently transmitting 10-bit code is other than five, the currently transmitting 10-bit code has data having a polarity differing from the polarity of data of the previously transmitting 10-bit code.

In FIG. 5B, for example, the third serial data from the left has six "1" bits. Hence, the SER function part 110 reverses the polarity of the current serial data from RD+(i.e., the polarity of the second code from the left) to RD−. Subsequently, the fourth serial data has four "1" bits. Hence, the SER function part 110 reverses the polarity of the current serial data from RD− (i.e., the polarity of the third code from the left) to RD+. Subsequently, the fifth serial data has five "1" bits. Hence, the SER function part 110 maintains the polarity of the current serial data as RD+(i.e., the polarity of the fourth code from the left). Subsequently, the sixth serial data has six "1" bits. Hence, the SER function part 110 reverses the polarity of the current serial data from RD+(i.e., the polarity of the fifth code from the left) to RD+.

Figure 6:
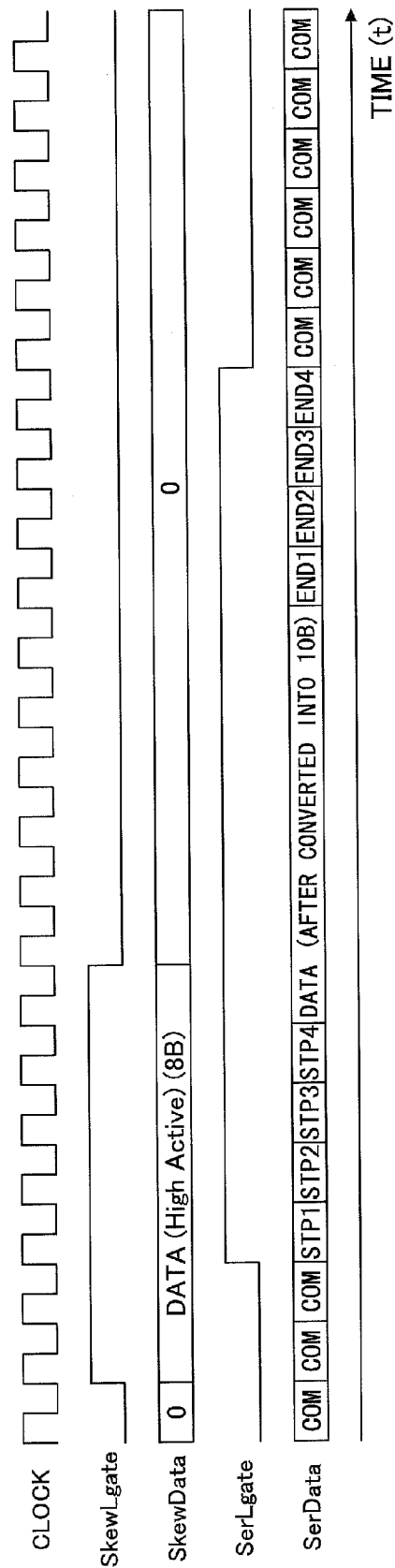
FIG. 6 is a diagram illustrating a timing chart of output of the serializer.

FIG. 6 is a diagram illustrating a timing chart of output of the serializer. A horizontal axis in FIG. 6 indicates time.

Clock indicates an operating clock of the SER function part 110. SkewLgate indicates positions of a head end and a tail end of the 8-bit code string (image data) input into the SER function part 110. SkewData indicates the 8-bit code string (image data) input into the SER function part 110. SerLgate indicates positions of a head end of a symbol code string "STP" and a tail end of the symbol code string "END". Note that the symbol code "STP" is a code used to detect a starting point of the image data. The symbol code "END" is a code used to detect an ending point of the image data. In the following, the symbol code "STP" is called a "STP code", and the symbol code "END" is called an "END code".

SerData indicates COM codes, STP codes, END codes, and image data that are converted into 10 bits.

The skew corrector 108 is configured to detect the positions of the head end and the tail end of the image data by detecting edges of SkewLgate to acquire the 8-bit code string. The skew corrector 108 transmits the acquired 8-bit code string to the 8B/10B converter 109. The 8B/10B converter 109 attaches plural STP codes to the front of the 8-bit code string, and attaches plural END codes to the back of the 8-bit code string. Subsequently, the 8B/10B converter 109 detects positions other than the position of the image data by detecting edges of SerLgate, and generates SerData by attaching plural COM codes to the positions other than that of the image data. Thus, a distance between the image data may be increased by attaching the plural COM codes to the positions other than the position of the image data.

FIG. 7 is a diagram illustrating an example of a conversion table. The 8B/10B converter 109 converts the 8-bit symbol code into 10-bit symbol code based on the conversion table of FIG. 7. "Symbol Name" indicates a type of the symbol code. There are twelve types of symbol codes, and each type is assigned to a corresponding one of the symbol codes including one type of the COM code, five types of the STP codes (STP 1 to 5), five types of the END codes (END 1 to 5). "Data Byte Name" indicates a name of the symbol code. "Data Byte Value (hex)" indicates an 8-bit symbol code in hexadecimal representation. "8B code" indicates an 8-bit symbol code. "10B code" indicates 10-bit symbol code having RD+ and RD− polarities corresponding to the 8-bit symbol code.

The COM data may be assigned by a COM code including 5T such as K28.5 for facilitating the detection of the boundary between the image data.

The STP code and END code may be assigned by symbol codes having analogous data arrays. For example, the 8B codes from the second to sixth lines (columns) of the conversion table of FIG. 7 are assigned to the STP codes. In the following, the 8B codes from the second to sixth lines (columns) of the conversion table of FIG. 7 are called a first code group. That is, K23.7, K27.7, K29.7, K30.7, and K28.7 are assigned to the STP codes STP1 to STP5, respectively. Note that since the STP5 assigned by the K28.7 includes 5T within the code, the 8B/10B converter 109 may preferentially use the STP1 to STP4.

Further, the 8B codes from the seventh to 11$^{th}$ lines (columns) of the conversion table of FIG. 7 are assigned to the END codes. In the following, the 8B codes from the seventh to 11th lines (columns) of the conversion table of FIG. 7 is called a second code group. That is, K28.0, K28.1, K28.2, K28.3, and K28.4 are assigned to the END1 to END5, respectively. Note that since the END2 (K28.2) includes 5T within the code, the 8B/10B converter 109 may preferentially use the END1, and the END3 to the END5.

Note that the SER function part 110 may transmit size information of the image data such as the number of pixels for one line or the number of bytes for one line separately to a DES function part 303 and a DES function part 403. In such a case, when the DES function part 303 is able to detect the boundary between the STP code and the image data, the DES function part 303 is also able to detect the boundary between the END code and the image data.

Figure 8:
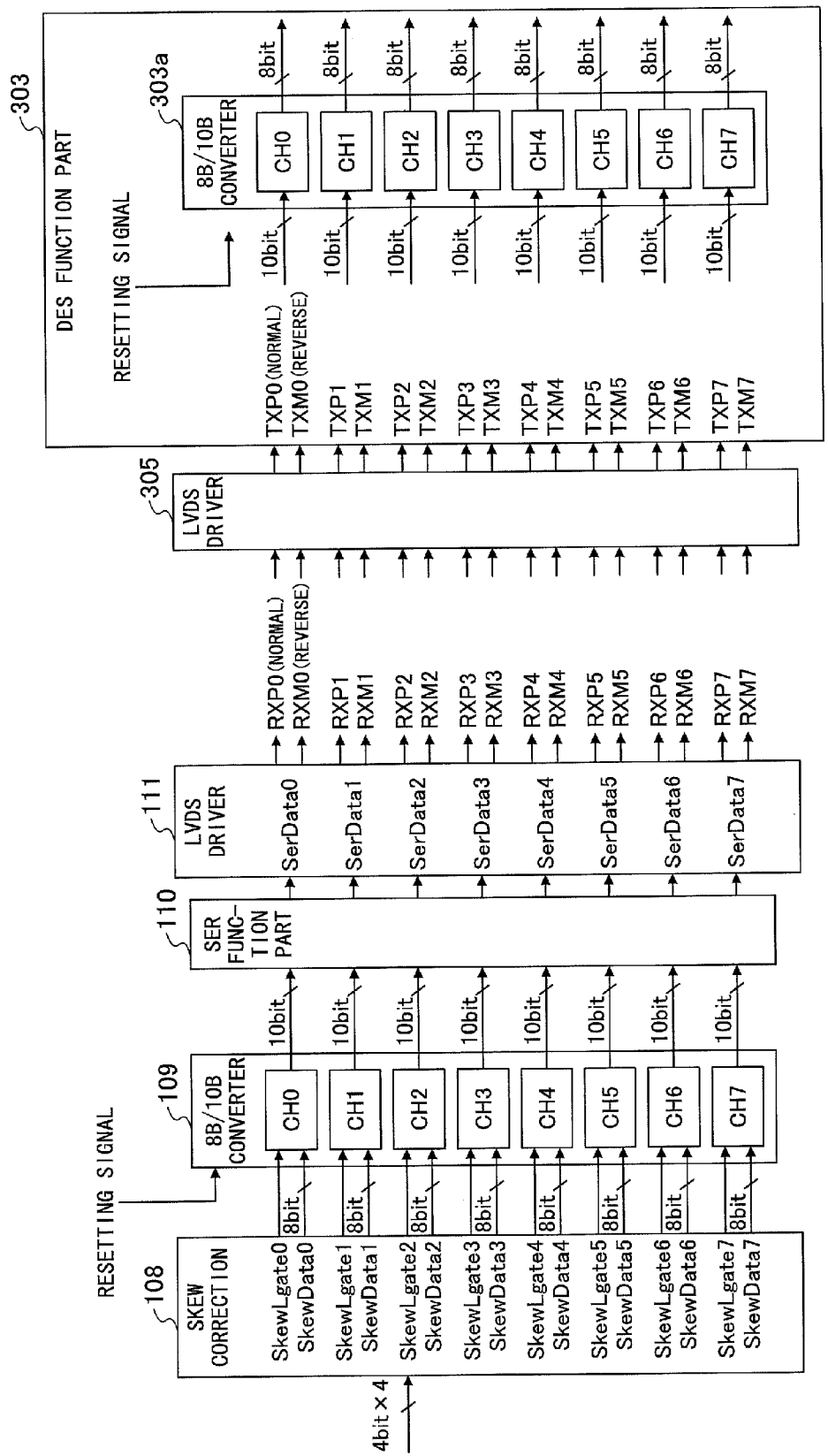
FIG. 8 is a diagram illustrating an example of serializer-deserializer connection.

FIG. 8 is a diagram illustrating an example of serializer-deserializer connection. The skew corrector 108 divides image data of four lines (4 bits×4) having four bits in one pixel into 8-bit codes, and sequentially transmits each of the divided 8-bit codes to the 8B/10B converter 109. For example, the skew corrector 108 transmits SkewLgate 0 to 7 and SkewData 0 to 7 (8-bit codes) to channels CH0 to 7, respectively. The 8B/10B converter 109 acquires SkewData 0 to 7 (8-bit codes) by detecting edges of SkewLgate 0 to 7 in the channels CH0 to 7. Subsequently, the 8B/10B converter 109 converts the 8-bit codes into the 10-bit codes, and transmits the converted 10-bit codes to the SER function part 110.

Note that the 8B/10B converter 109 may not use part of the channels CH0 to 7 by a resetting signal. For example, in color printing, the 8B/10B converter 109 uses all the channels CH0 to 7. On the other hand, in monochrome printing, the 8B/10B converter 109 uses the channels 0 to 1, and does not use channels 2 to 7 by the resetting signal.

The 8B/10B converter 109 may determine whether to use the forward-order serializer or the reverse-order serializer for transferring the serial data (10-bit codes), and convert the 8-bit codes into the 10-bit codes in the channels CH0 to 7, respectively.

For example, when the 8B/10B converter 109 uses the forward-order serializer, the 8B/10B converter 109 selects a forward-order RD rule. Subsequently, the 8B/10B converter 109 converts the 8-bit codes into the 10-bit codes based on the forward-order RD rule.

On the other hand, when the 8B/10B converter 109 uses the reverse-order serializer, the 8B/10B converter 109 selects a reverse-order RD rule. Subsequently, the 8B/10B converter 109 converts the 8-bit codes into the 10-bit codes based on the reverse-order RD rule.

The 8B/10B converter 109 subsequently outputs the converted 10-bit codes to the SER function part 110.

Note that when the 8B/10B converter 109 uses the forward-order serializer, but selects the reverse-order RD rule, or when the 8B/10B converter 109 uses the reverse-order serializer, but selects the forward-order RD rule, 6T may be generated in the 10-bit code strings.

When the SER function part 110 uses the forward-order serializer, the SER function part 110 acquires respective bits in order from the LSB of the coded block, and sets the acquired bits in the LVDS driver 111. On the other hand, when the SER function part 110 uses the reverse-order serializer, the SER function part 110 acquires respective bits in order from the MSB of the coded block, and sets the acquired bits in the LVDS driver 111. The LVDS driver 111 subsequently transmits bit strings in the set order to the LVDS driver 305.

Figure 9A:
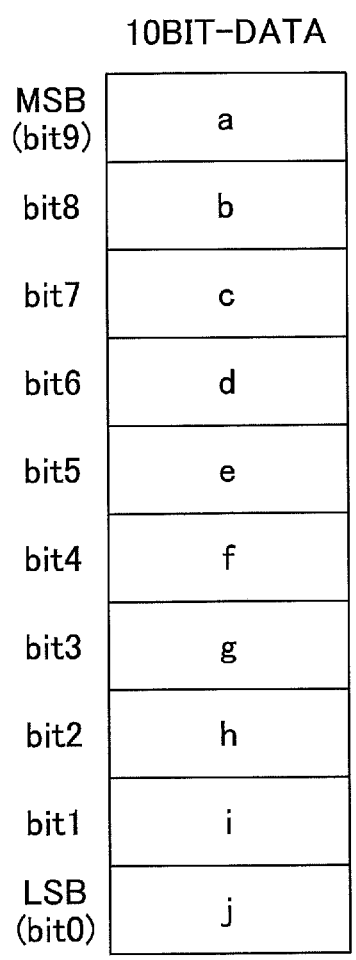
FIGS. 9A and 9B are diagrams illustrating a data output process of a deserializer.
Figure 9B:
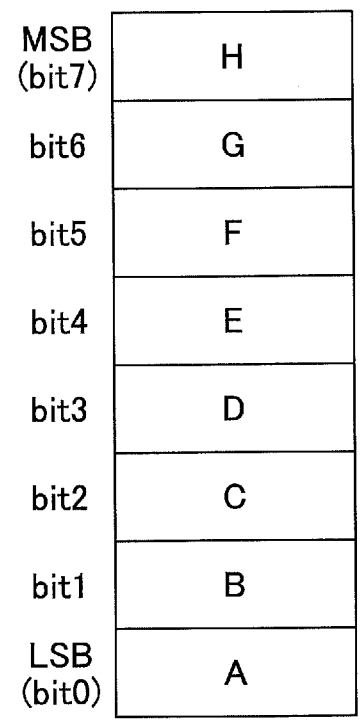

FIGS. 9A and 9B are diagrams illustrating a data output process of a deserializer. FIG. 10 is a diagram illustrating an example of a conversion table for use in a deserializing process. An illustration is given of the deserializer when serial data are received with reference to FIGS. 9A and 9B, and FIG. 10. The DES function part 303 is configured to acquire 10-bit reverse-order serialized serial data in order from the higher-order bits, and store the acquired serial data in order from the LSB of the coded block illustrated in FIG. 9A. That is, the coded block illustrated in FIG. 9A sequentially stores j, h, g, f, e, d, c, b and a bits in order from the LSB. Subsequently, the DES function part 303 converts the 10-bit serial data stored in the coded block illustrated in FIG. 9A into 8-bit serial data based on the conversion table illustrated in FIG. 10. Note that the conversion table illustrated in FIG. 10 differs from the conversion table illustrated in FIG. 7, in that the order of the bit strings illustrated in the 10B code columns is reversed.

Subsequently, the DES function part 303 acquires the converted 8-bit serial data in order from the higher-order bits, and stores the acquired 8-bit serial data in order from the LSB of the coded block illustrated in FIG. 9B. The data output of the deserializer is thus completed. Note that when the forward-order serializer is user for the serial data, the DES function part 303 performs deserializing using the conversion table of FIG. 7.

FIGS. 11A and 11B are diagrams illustrating examples of combinations that generate 5T between the STP code and the head end of the image data. FIG. 11A illustrates combinations that generate 5T between the STP code and the head end of the image data when the forward-order serializer is used. As illustrated in FIG. 7, the tail end of the STP code includes three continuous 0s or 1s to indicate 3T. Accordingly, when the forward-order serializer is used, 5T may be more likely to be generated between the STP code and the head end of the image data.

More specifically, there are 240 combinations for generating 5T, there are 256 8-bit image data sets, there are five STP codes, and there are two polarities. Thus, the number of combinations as a whole is 2560. Accordingly, when the forward-order serializer is used, the probability of generating 5T between the STP code and the head end of the image data is (240/2560)×100%=9.375%.

Further, when the forward-order serializer is used, all the STP1 to SIP5 include combinations that generate 5T. Hence, the STP1 to SIP5 are unlikely to avoid generating 5T even if the code assignment of the STP1 to SIP5 is changed.

On the other hand, when the reverse-order serializer is used, the probability of generating 5T between the STP code and the head end of the image data is (6/2560)×100%=0.234%. In addition, the combinations that generate 5T are limited to the combinations that have used K28.7 (SIP5). Hence, 5T may be prevented from being generated by not using the STP 5 between the STP code and the head end of the image data. Accordingly, signals may be more stabilized for serially transferring the image data.

In the first embodiment, detection accuracy in the deserializer may be improved by setting the STP codes as the first code group and using the reverse-order serializer, which may implement high quality and high-speed serial data transferring.

FIGS. 12A and 12B are diagrams illustrating examples of combinations that generate 5T between the END code and the tail end of the image data. FIG. 12A illustrates combinations that generate 5T between the END code and the tail end of the image data when the reverse-order serializer is used. As illustrated in FIG. 7, the head end of the END code includes two continuous 0s or 1s to indicate 2T. Accordingly, when the reverse-order serializer is used, 5T may be more likely to be generated between the END code and the tail end of the image data.

More specifically, there are 30 combinations for generating 5T, and the number of combinations as a whole is 2560. Accordingly, when the reverse-order serializer is used, the probability of generating 5T between the END code and the tail end of the image data is (30/2560)×100%=1.172%.

Further, when the reverse-order serializer is used, all the END1 to END5 include combinations that generate 5T. Hence, the END1 to END5 are unlikely to avoid generating 5T even if the code assignment of the END1 to END5 is changed.

On the other hand, when the forward-order serializer is used, the probability of generating 5T between the END code and the tail end of the image data is 0%. Hence, 5T may be prevented from being generated between the END code and the tail end of the image data by using the forward-order serializer. Accordingly, signals may be more stabilized for serially transferring the 8B10B converted image data.

In this embodiment, detection accuracy in the deserializer may be improved by setting the END codes as the second code group and using the forward-order serializer, which may implement high quality and high-speed serial data transferring.

The writing data transfer system 1 according to the embodiment is described above; however, the present invention is not limited to the embodiment described above. Various alteration and modification may be made within the scope of the claims. For example, the VCSELs are used as exposing units in this embodiment; however, the exposing units are not limited to the VCSELs, and the exposing units may be LDs. Further, an LED head, an organic EL head, or an LD array head may be used for a line head.

Further, the application of the above-described high-speed serial transferring is not limited to the image data transferring. The high-speed serial transferring may be applied to those other than the image data transferring.

The following illustrates programs for performing the above-described processes or functions as well as a recording medium storing the program and data. Examples of the recording medium include a CR-ROM, a magneto-optical disk, a DVD-ROM, a flexible disk (FD), a flash memory, a memory card, a memory stick, and other various types of ROMs and RAMs. The processes of the embodiment may be implemented by causing a computer to execute the program stored in the recording medium. Further, the aforementioned processes of the communications control method or the functions of the serial communications apparatus may be easily implemented by distributing the above-described programs via the recording media storing the above-described programs or via networks.

Note that in the above embodiment, the 8B/10B converter 109 is an example of a converter. The SER function part 110 is an example of a transmitter. The image data are an example of a target code. The STP code is an example of a starting code, and the END code is an example of an ending code.

The present invention is not limited to the specifically disclosed embodiments, and variations and modifications may be made without departing from the scope of the present invention.

The present application is based on and claims the benefit of priority of Japanese Priority Application No. 2015-120605 filed on Jun. 15, 2015, the entire contents of which are hereby incorporated herein by reference.

What is claimed is:

1. A communications apparatus serially transmitting a code string including a target code subject to being transmitted using 8B10B conversion, the communications apparatus comprising:
   a converter configured to convert an 8-bit starting code into a 10-bit starting code, and an 8-bit target code into a 10-bit target code, a starting code indicating a transmission starting position of the target code, and being transmitted before the target code, each of the converted 10-bit starting code and the converted 10-bit target code including first polarities and second polarities, the second polarity having a bit string reversed from a bit string associated with the first polarity, wherein when the converted 10-bit starting code and the converted 10-bit target code each include a number of "0" bits equal to a number of "1" bits, the converter converts the converted 10-bit starting code and the converted 10-bit target code into a 10-bit starting code and a 10-bit target code having polarities identical to the polarities of a previously transmitted 10-bit starting code and a previously transmitted 10-bit target code, respectively, and wherein when the converted 10-bit starting code and the converted 10-bit target code each include a number of "0" bits differing from a number of "1" bits, the converter converts the converted 10-bit starting code and the converted 10-bit target code into a 10-bit starting code and a 10-bit target code having polarities differing from the polarities of the previously transmitted 10-bit starting code and the previously transmitted 10-bit target code, respectively; and
   a transmitter configured to serially transmit the bits of each of the converted 10-bit starting code and the converted 10-bit target code in order from lower-order bits.

2. The communications apparatus as claimed in claim 1, wherein the code string further includes an ending code indicating a transmission ending position of the target code, and configured to be transmitted after the target code, the converter converting a 8-bit ending code into a 10-bit ending code,
   wherein when the converted 10-bit ending code includes a number of "0" bits equal to a number of "1" bits, the converter converts the converted 10-bit ending code into a 10-bit ending code having a polarity identical to a polarity of a previously transmitted 10-bit ending code, and
   wherein when the converted 10-bit ending code includes a number of "0" bits differing from a number of "1" bits, the converter converts the converted 10-bit ending code into a 10-bit ending code having a polarity differing from a polarity of a previously transmitted 10-bit ending code.

3. The communications apparatus as claimed in claim 2, wherein the converter converts the ending code into an any one of 10-bit codes included in a second code group.

4. The communications apparatus as claimed in claim 3, wherein the converter converts the ending code into an any one of 10-bit codes included in a first code group excluding 10-bit codes having five or more sequential 0s or 1s.

5. The communications apparatus as claimed in claim 1, wherein the converter converts the starting code into an any one of 10-bit codes included in a first code group.

6. The communications apparatus as claimed in claim 5, wherein the converter converts the starting code into an any one of 10-bit codes included in the first code group excluding 10-bit codes having five or more sequential 0s or 1s.

7. A communications method performed by a communications apparatus for serially transmitting a code string including a target code subject to being transmitted using 8B10B conversion, the communications method comprising:

converting, by a converter, an 8-bit starting code into a 10-bit starting code, and an 8-bit target code into a 10-bit target code, a starting code indicating a transmission starting position of the target code, and being transmitted before the target code, each of the converted 10-bit starting code and the converted 10-bit target code including first polarities and second polarities, the second polarity having a bit string reversed from a bit string associated with the first polarity, wherein when the converted 10-bit starting code and the converted 10-bit target code each include a number of "0" bits equal to a number of "1" bits, the converter converts the converted 10-bit starting code and the converted 10-bit target code into a 10-bit starting code and a 10-bit target code having polarities identical to the polarities of a previously transmitted 10-bit starting code and a previously transmitted 10-bit target code, respectively, and wherein when the converted 10-bit starting code and the converted 10-bit target code each include a number of "0" bits differing from a number of "1" bits, the converter converts the converted 10-bit starting code and the converted 10-bit target code into a 10-bit starting code and a 10-bit target code having polarities differing from the polarities of the previously transmitted 10-bit starting code and the previously transmitted 10-bit target code, respectively; and serially transmitting, by a transmitter, the bits of each of the converted 10-bit starting code and the converted 10-bit target code in order from lower-order bits.

8. The communications method of claim 7,
wherein the code string further includes an ending code indicating a transmission ending position of the target code, and is to be transmitted after the target code, the converter converting a 8-bit ending code into a 10-bit ending code,
wherein when the converted 10-bit ending code includes a number of "0" bits equal to a number of "1" bits, the converter converts the converted 10-bit ending code into a 10-bit ending code having a polarity identical to a polarity of a previously transmitted 10-bit ending code, and
wherein when the converted 10-bit ending code includes a number of "0" bits differing from a number of "1" bits, the converter converts the converted 10-bit ending code into a 10-bit ending code having a polarity differing from a polarity of a previously transmitted 10-bit ending code.

9. The communications method of claim 8,
wherein the converter converts the ending code into an any one of 10-bit codes included in a second code group.

10. The communications method of claim 9,
wherein the converter converts the ending code into an any one of 10-bit codes included in a first code group excluding 10-bit codes having five or more sequential 0s or 1s.

11. The communications method of claim 7,
wherein the converter converts the starting code into an any one of 10-bit codes included in a first code group.

12. The communications method of claim 11,
wherein the converter converts the starting code into an any one of 10-bit codes included in the first code group excluding 10-bit codes having five or more sequential 0s or 1s.

13. A non-transitory computer-readable medium embodying programmed instructions for serially transmitting a code string including a target code subject to being transmitted using 8B10B conversion, which, when executed by a processor of a communication apparatus, direct the processor to:

convert an 8-bit starting code into a 10-bit starting code, and an 8-bit target code into a 10-bit target code, a starting code indicating a transmission starting position of the target code, and being transmitted before the target code, each of the converted 10-bit starting code and the converted 10-bit target code including first polarities and second polarities, the second polarity having a bit string reversed from a bit string associated with the first polarity, wherein when the converted 10-bit starting code and the converted 10-bit target code each include a number of "0" bits equal to a number of "1" bits, convert the converted 10-bit starting code and the converted 10-bit target code into a 10-bit starting code and a 10-bit target code having polarities identical to the polarities of a previously transmitted 10-bit starting code and a previously transmitted 10-bit target code, respectively, and wherein when the converted 10-bit starting code and the converted 10-bit target code each include a number of "0" bits differing from a number of "1" bits, convert the converted 10-bit starting code and the converted 10-bit target code into a 10-bit starting code and a 10-bit target code having polarities differing from the polarities of the previously transmitted 10-bit starting code and the previously transmitted 10-bit target code, respectively; and serially transmit the bits of each of the converted 10-bit starting code and the converted 10-bit target code in order from lower-order bits.

14. The non-transitory computer-readable medium of claim 13,
wherein the code string further includes an ending code indicating a transmission ending position of the target code, and is to be transmitted after the target code, the programmed instructions further direct the processor to convert a 8-bit ending code into a 10-bit ending code,
wherein when the converted 10-bit ending code includes a number of "0" bits equal to a number of "1" bits, the programmed instructions further direct the processor to convert the converted 10-bit ending code into a 10-bit ending code having a polarity identical to a polarity of a previously transmitted 10-bit ending code, and
wherein when the converted 10-bit ending code includes a number of "0" bits differing from a number of "1" bits, the programmed instructions further direct the processor to convert the converted 10-bit ending code into a 10-bit ending code having a polarity differing from a polarity of a previously transmitted 10-bit ending code.

15. The non-transitory computer-readable medium of claim 14, wherein the programmed instructions further direct the processor to convert the ending code into an any one of 10-bit codes included in a second code group.

16. The non-transitory computer-readable medium of claim 15,
wherein the programmed instructions further direct the processor to convert the ending code into an any one of 10-bit codes included in a first code group excluding 10-bit codes having five or more sequential 0s or 1s.

17. The non-transitory computer-readable medium of claim 13,
wherein the programmed instructions further direct the processor to convert the starting code into an any one of 10-bit codes included in a first code group.

18. The non-transitory computer-readable medium of claim 17,
wherein the programmed instructions further direct the processor to convert the starting code into an any one of 10-bit codes included in the first code group excluding 10-bit codes having five or more sequential 0s or 1s.

* * * * *